(12) United States Patent
Weber et al.

(10) Patent No.: US 7,907,395 B2
(45) Date of Patent: Mar. 15, 2011

(54) HEAT REMOVAL SYSTEM FOR COMPUTER ROOMS

(75) Inventors: Richard M. Weber, Prosper, TX (US); William G. Wyatt, Plano, TX (US)

(73) Assignee: Raytheon Company, Waltham, MA (US)

(*) Notice: Subject to any disclaimer, the term of this patent is extended or adjusted under 35 U.S.C. 154(b) by 16 days.

(21) Appl. No.: 12/404,784

(22) Filed: Mar. 16, 2009

(65) Prior Publication Data

US 2009/0244829 A1 Oct. 1, 2009

Related U.S. Application Data

(60) Provisional application No. 61/040,501, filed on Mar. 28, 2008, provisional application No. 61/040,514, filed on Mar. 28, 2008.

(51) Int. Cl.
G06F 1/20 (2006.01)
H05K 7/20 (2006.01)
H05K 5/00 (2006.01)

(52) U.S. Cl. ........... 361/679.47; 361/679.48; 361/679.5; 361/679.52; 361/694; 361/700; 361/703; 361/704; 361/679.49; 165/185; 454/184

(58) Field of Classification Search .......... 361/679.47–679.49, 679.52–679.54, 361/690, 694–701, 703–704, 715–716; 165/80.2–80.5, 104.33, 185; 174/15.2, 16.1, 174/16.3; 454/184
See application file for complete search history.

(56) References Cited

U.S. PATENT DOCUMENTS

| 3,595,304 | A | * | 7/1971 | McHugh | 165/104.16 |
|---|---|---|---|---|---|
| 4,884,628 | A | * | 12/1989 | En-Jian et al. | 165/104.27 |
| 5,579,830 | A | * | 12/1996 | Giammaruti | 165/104.27 |
| 6,006,998 | A | * | 12/1999 | Rerolle | 237/70 |
| 6,675,874 | B2 | * | 1/2004 | Mast et al. | 165/45 |
| 2003/0116309 | A1 | | 6/2003 | Dispenza et al. | |
| 2007/0289303 | A1 | * | 12/2007 | Prueitt | 60/641.7 |
| 2009/0008063 | A1 | * | 1/2009 | Salinas et al. | 165/104.26 |
| 2009/0242170 | A1 | * | 10/2009 | Weber | 165/80.3 |

FOREIGN PATENT DOCUMENTS

| EP | 0 910 235 | | 4/1999 |
|---|---|---|---|
| FR | 1 266 244 | | 7/1961 |
| JP | 58208591 | A * | 12/1983 |
| JP | 10122773 | A * | 5/1998 |
| WO | WO 2006/059215 | | 6/2006 |
| WO | WO 2007/029125 | | 3/2007 |

OTHER PUBLICATIONS

Bellar et al., "Thin Heat Pipe for Cooling Comonents on Printed Circuit Boards", IBM Technical Disclosure, vol. 34, No. 7B, Dec. 1991, pp. 321-322.*
PCT Notification of Transmittal of the International Search Report and the Written Opinion of the International Searching Authority, or the Declaration, PCT/US2009/037740, dated Jun. 16, 2009.

* cited by examiner

*Primary Examiner* — Robert J Hoffberg
(74) *Attorney, Agent, or Firm* — Baker Botts L.L.P.

(57) ABSTRACT

According to one embodiment, a heat removal system for a computer room includes a heat pipe having two ends. One of the ends is thermally coupled to one or more of a number of components forming a portion of a computing system. The other end is thermally coupled to a heat dissipation mechanism. The heat pipe is operable to move heat from the components of the computing system to the heat dissipation mechanism.

24 Claims, 2 Drawing Sheets

HEAT REMOVAL SYSTEM FOR COMPUTER ROOMS

RELATED APPLICATIONS

Pursuant to 35 U.S.C. §119(e), this application claims priority to U.S. Provisional Patent Application Ser. No. 61/040,501, entitled HEAT REMOVAL SYSTEM FOR COMPUTER ROOMS, filed Mar. 28, 2008. U.S. Provisional Patent Application Ser. No. 61/040,501 is hereby incorporated by reference.

Pursuant to 35 U.S.C. §119(e), this application claims priority to U.S. Provisional Patent Application Ser. No. 61/040,514, entitled COOLING FINS FOR A HEAT PIPE, filed Mar. 28, 2008. U.S. Provisional Patent Application Ser. No. 61/040,514 is hereby incorporated by reference.

TECHNICAL FIELD OF THE DISCLOSURE

This disclosure generally relates to heat removal devices, and more particularly, to a heat removal system for a computer room.

BACKGROUND OF THE DISCLOSURE

Computing systems having multiple components, such as computer clusters or Internet data centers (IDCs), may be housed in a computer room. The computer room provides a controlled environment for the computing system's operation. The computer room may also include fire suppression mechanisms or security systems for protection from natural or man-made attacks. Colloquially, computer rooms may be also be referred to as data centers.

SUMMARY OF THE DISCLOSURE

According to one embodiment, a heat removal system for a computer room includes a heat pipe having two ends. One of the ends is thermally coupled to one or more of a number of components forming a portion of a computing system. The other end is thermally coupled to a heat dissipation mechanism. The heat pipe is operable to move heat from the components of the computing system to the heat dissipation mechanism.

Certain embodiments of the disclosure may provide numerous technical advantages. For example, a technical advantage of one embodiment may include the capability to provide substantial energy savings. Other technical advantages of other embodiments may include the capability to eliminate the need for air filtration and humidity control. Yet other technical advantages of some embodiments may include the capability to fit more computing racks into a single computer room.

Although specific advantages have been enumerated above, various embodiments may include all, some, or none of the enumerated advantages. Additionally, other technical advantages may become readily apparent to one of ordinary skill in the art after review of the following figures and description.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF EXAMPLE EMBODIMENTS

It should be understood at the outset that, although example implementations of embodiments of the invention are illustrated below, the present invention may be implemented using any number of techniques, whether currently known or not. The present invention should in no way be limited to the example implementations, drawings, and techniques illustrated below. Additionally, the drawings are not necessarily drawn to scale.

Computer rooms may house computing systems and provide any of a number of support services to maintain operation of the same. The Telecommunications Industry Association (TIA) has issued a white paper (TIA-942) "Data Center Standards Overview" describing various aspects of computer room design and maintenance. One particular aspect of computer room operation is the removal of heat or thermal energy generated by computing systems. The components of larger computing systems may be configured on multiple computing racks that may sometimes be aligned in rows within the computer room. During operation, components of the computing system in each computing rack may generate up to 15 Kilo-watts of heat.

Known heat removal systems, such as computer room air conditioners (CRACs), remove heat from computing system components by pumping cool air through the computing racks on which the components are configured. However, the air circulated by these known computer room air conditioners must be filtered and humidity controlled before being blown over the relatively intricate computing system components. Air filtration and humidity control may increase energy costs while reducing air pressure within the computer room. In addition, CRAC systems cannot adequately cool tightly-packed computer systems in a computer room, thus reducing the number of computing racks that may be placed in a computer room.

Accordingly, teachings of certain embodiments recognize the use of heat pipes to remove heat from a computer room. Teachings of certain embodiments recognize that heat pipes may eliminate the need for air filtration and humidity control. Teachings of certain embodiments also recognize that heat pipes may provide substantial energy savings over CRAC systems. Teachings of certain embodiments also recognize that heat pipes may enable more computing racks to be stored in a computer room.

Figure 1:
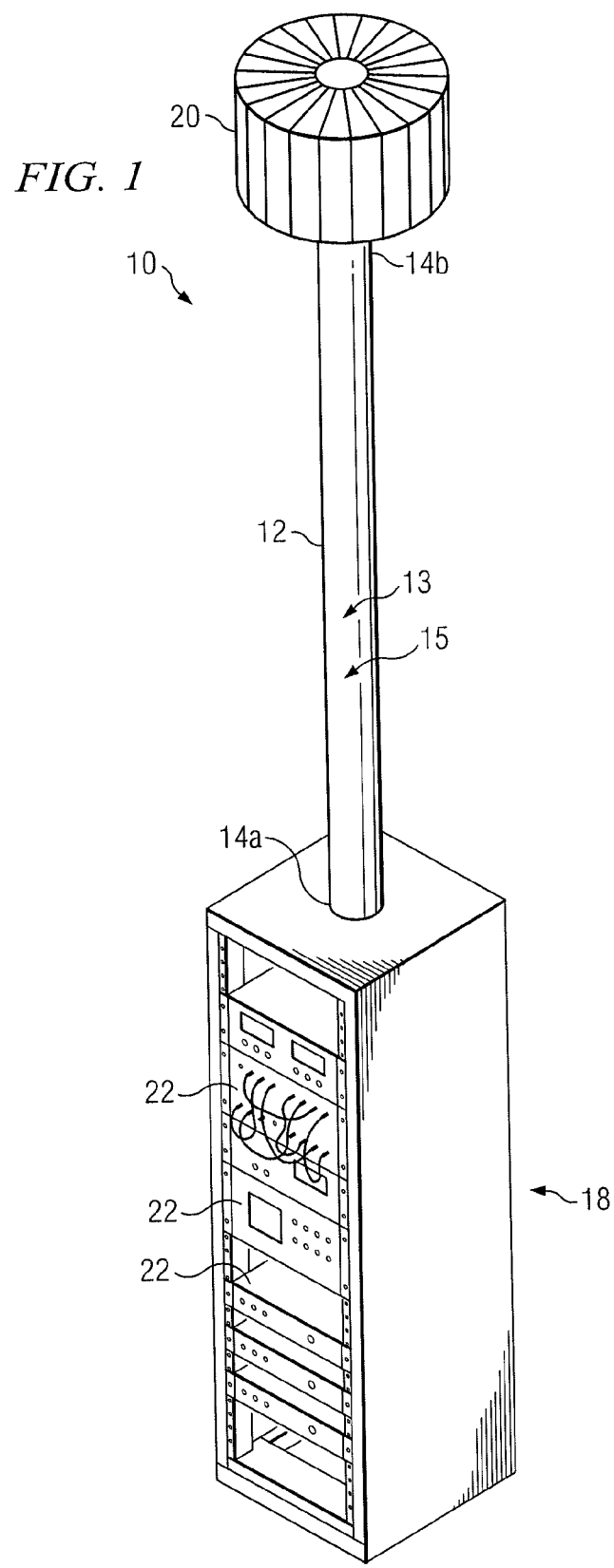
FIG. 1 is a perspective view of one embodiment of a heat removal system coupled to a computing rack according to the teachings of the present disclosure.

FIG. 1 shows a heat removal system 10 according to one embodiment. Heat removal system 10 generally includes a heat pipe 12 having a lower end 14a and an upper end 14b. The lower end 14a is thermally coupled to a computing rack 18 that houses one or more components 22 of a computing system and the upper end 14b is thermally coupled to a heat dissipation mechanism 20. According to the teachings of the present disclosure, the heat pipe 12 may be operable to move heat from components 22 mounted in computing rack 18 to the heat dissipation mechanism 20. The heat or thermal energy generated by components 22 of computing rack 18 may be transferred to the lower end 14a of the heat pipe 12 in any suitable manner. In particular embodiments, any of a variety of devices or techniques may be utilized to facilitate such a transfer.

Heat pipe 12 may be any suitable structure that is configured to move heat from one end of its structure to another. In one embodiment, heat pipe 12 may have a hollow inner portion that is at least partially filled with a refrigerant 13. Examples of the refrigerant 13 may include, but are not limited to, water or other suitable fluids. During operation, the refrigerant 13 in its liquid phase may migrate toward lower end 14a having a lower elevation than the upper end 14b. Evaporation of the refrigerant 13 at lower end 14a may soak up heat according to the thermodynamic principle of latent heat of vaporization. Upon evaporation, the refrigerant 13 may migrate toward upper end 14b for dissipation of absorbed heat by heat dissipation mechanism 20. In some embodiments, the heat pipe 12 may be pressurized such that the refrigerant 13 evaporates at a lower temperature.

In some embodiments, the specific volume of the refrigerant 13 as a vapor may be much larger than the specific volume of the refrigerant 13 as a liquid. For example, in some embodiments, a ratio of the specific volume of a refrigerant gas as compared to a refrigerant liquid may be on the order of 5000:1. Teachings of certain embodiments recognize that condensation of the refrigerant 13 at the upper end 14b may create a vacuum at the upper end 14b, providing a vacuum force to draw vaporized refrigerant up the heat pipe 12.

Heat pipe 12 may be any suitable structure that is configured to move heat from a lower end 14a to an upper end 14b. For example, in the embodiment illustrated in FIG. 1, the heat pipe 12 is illustrated as having a lower end 14a and an upper end 14b. However, embodiments of the heat pipe 12 may be oriented in any suitable direction. In the illustrated embodiment, refrigerant in its liquid phase may migrate toward lower end 14a during operation. Evaporation of the refrigerant at the lower end 14a may soak up heat according to the thermodynamic principle of latent heat of vaporization. Upon evaporation, the refrigerant may migrate towards upper end 14b for dissipation of heat by heat dissipation mechanism 20.

In some embodiments, the hollow inner portion of heat pipe 12 may include a porous material 15 for aiding movement of the refrigerant by capillary action. Examples of the porous material 15 may including a wicking material. Examples of the wicking material may include embodiments described by U.S. patent application Ser. No. 11/773,267, entitled System and Method for Passive Cooling Using a Non-Metallic Wick, filed Jul. 3, 2007. U.S. patent application Ser. No. 11/773,267 is hereby incorporated by reference.

Upper end 14b may be coupled to heat dissipation mechanism 20 for the removal of heat from heat pipe 12. In the embodiment illustrated in FIG. 1, the heat dissipation mechanism 20 is illustrated as a number of cooling fins. For example, in the illustrated embodiment, the heat dissipation mechanism 20 is a number of condenser radial fans. Examples of the cooling fins may include embodiments described by U.S. Provisional Patent Application Ser. No. 61/040,514, previously incorporated by reference.

In other embodiments, any suitable heat dissipation mechanism 20 may be used. For example, upper end 14b of heat pipe 12 may be thermally coupled to a heat exchanger that circulates cooling fluid across upper end 14b for removal of heat. In another embodiment, the heat dissipation mechanisms 20 may be partially or completely submerged in a stream of cooling water. In one example embodiment, the stream of cooling water may be provided by a local river or stream.

Heat pipe 12 and heat dissipation mechanism 20 may be made of any suitable material. In one embodiment, heat pipe 12 and/or heat dissipation mechanism 20 are constructed of a thermally conducting material such as metal. One example of a thermally conducting material may include copper. In another embodiment, the heat dissipation mechanism 20 may include cooling fins formed from a sheet of metal having two ends. The metal sheet may be bent along an edge and the two ends attached to heat pipe 12 by any suitable approach, such as welding, brazing, or using an adhesive, such as epoxy.

In particular embodiments, heat pipe 12 may be configured to move up to approximately 3 to 20 Kilo-watts of heat from computing rack 18. In one particular embodiment in which heat pipe 12 is 8 feet long, a heat pipe 12 having a diameter of approximately 4 inches may provide movement of heat in this range.

Computing rack 18 is configured with components 22 that may form a portion of a computing system, such as a computer cluster, an Internet server, or a telecommunication switch. Examples of components 22 that may be configured in computing rack 18 may include routers, network switches, cable interconnect boxes, power supplies, or personal computers.

Figure 2:
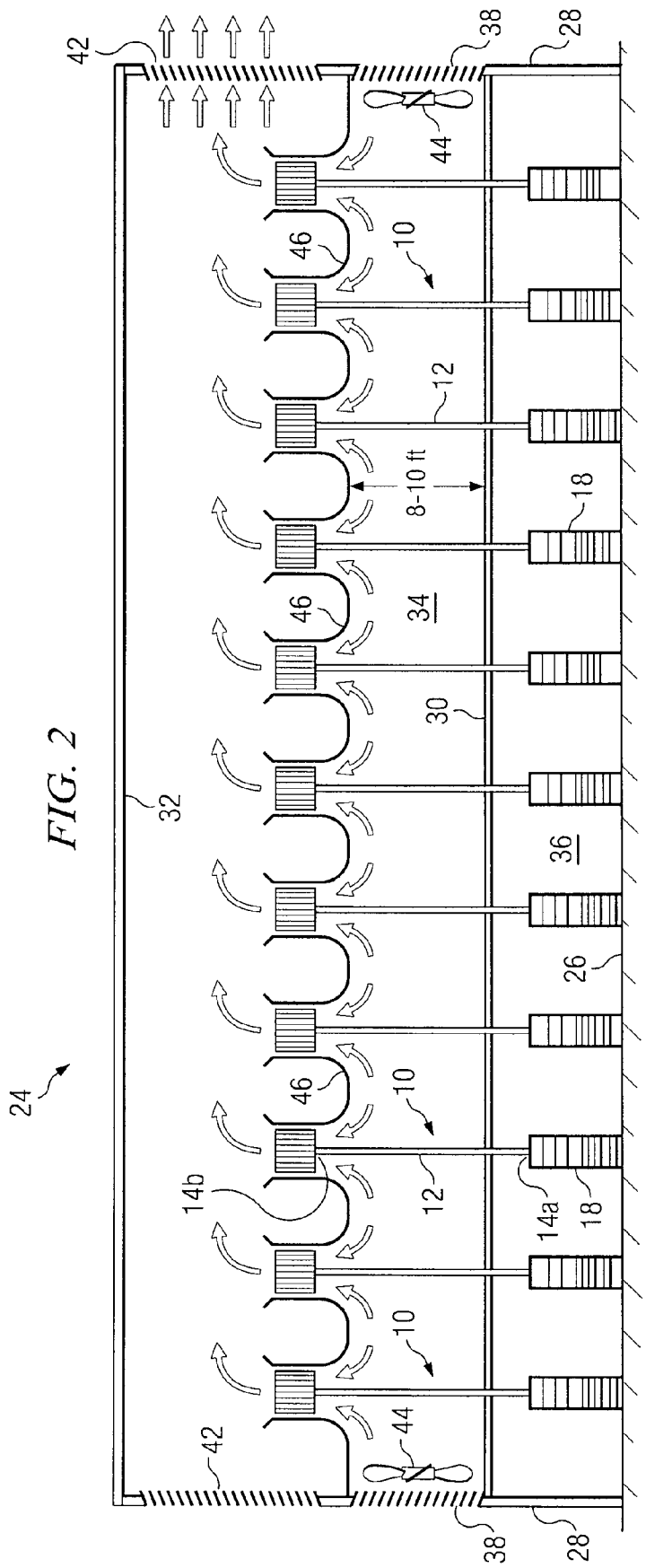
FIG. 2 is a cut-away view of one embodiment of a computer room configured with a number of heat removal systems of FIG. 1.

FIG. 2 shows a cut-away view of one embodiment of a server farm or computer farm 24 in which a number of heat removal systems 10 are coupled to computing racks 18. The server farm or computer farm 24 features a computing system compartment 36, which includes a ground floor 26, sidewalls 28, and a ceiling 30 as shown. The computing system compartment 36 houses the computing racks 18. The heat pipes 12 and the heat dissipation mechanisms 20 extend outside the computing system compartment 36 through the ceiling 30.

In some embodiments, the heat dissipation mechanisms 20 may be directly exposed to the outside atmosphere. For example, in some embodiments, the heat dissipation mechanisms 20 may be exposed to outside wind energy. The wind may force air past the heat dissipation mechanisms 20, thus facilitating transfer of thermal energy between the heat dissipation mechanism 20 and the outside air. In other embodiments, the heat dissipation mechanisms 20 may be exposed to other suitable fluid streams. For example, in one embodiment, the heat dissipation mechanisms 20 may be partially or completely submerged in a stream of cooling water. In one example embodiment, the stream of cooling water may be provided by a local river or stream.

In the embodiment illustrated in FIG. 2, the heat pipes 12 extend into a pressurized plenum 34. The pressurized plenum 34 in this embodiment is formed by the ceiling 30, a portion of sidewalls 28, and a roof 32. Ceiling 30 forms a barrier between pressurized plenum 34 and computing system compartment 36, such that air flow through pressurized plenum 34 in this embodiment does not mix with air in the computing system compartment 36.

Air movement through pressurized plenum 34 may be provided by one or more inlets 38 and one or more outlets 42. In some embodiments, the inlets 38 and/or the outlets 42 may include dampers to adjust flow. For example, the dampers may adjust flow depending on the heat load of the heat pipes 12. In another example, outlets 42 may be blocked-off.

The server or computer farm 24 may include any type of building or enclosure that houses computing systems, such as computer clusters, telecommunication equipment, or network computing systems. Computer farm 24 may also be referred to as a data center. In one embodiment, computer farm 24 may be constructed and maintained according to the (TIA-942) "Data Center Standards Overview" specification, which is incorporated herein by reference. In particular embodiments, the lower portion, including the computing system compartment 36, may correspond to a pre-existing server farm while the upper portion, including the pressurized 34, may correspond to a retrofit of the lower portion to aid removal of thermal energy generated in the server farm.

Certain embodiments of the present disclosure may provide a benefit in that air may be used to cool a computing system while not coming in contact with the components 22 of the computing system. Because of this separation, cooling air through pressurized plenum 34 may not need to be filtered and/or humidity controlled to as great a level as air coming in contact with computing system components 22. Additionally, because the computing racks 18 do not necessarily rely on circulation of air to facilitate removal of thermal energy, teachings of certain embodiments recognize that the computing racks 18 may be placed closer to one another than traditional CRAC designs.

Pressurized plenum 34 may also include one or more fans 44 that move air through pressurized plenum 34. In some embodiments, the pressurized plenum 34 may have a higher pressure than the ambient pressure if the fans 44 force more air into the pressurized plenum 34 faster than the air can escape. In these embodiments, the difference in pressure between the pressurized plenum 34 and the ambient pressure may force air past the heat dissipation mechanisms 20 and out of the pressurized plenum. In some embodiments, the speed of the fans 44 may be regulated to reduce flow on a cold day and reduce fan power consumed. Teachings of certain embodiments recognize that the fans 44 may be smaller and require less power than fans used in CRAC systems.

In one embodiment, cowlings 46 may be included that direct air movement through cooling fins 20. In the particular embodiment shown, cooling fins 20 and cowlings 46 are approximately 8 to 10 feet above ceiling 30; however, cooling fins 20 and cowlings 46 may be disposed at any height above ceiling 30 that provides for air movement through pressurized plenum 34.

In some embodiments, the cowlings 46 may separate the pressurized plenum 34 such that the region below the cowlings 46 has a higher pressure than the region above the cowlings 46.

Modifications, additions, or omissions may be made to the systems and apparatuses described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

Although the present invention has been described with several embodiments, a myriad of changes, variations, alterations, transformations, and modifications may be suggested to one skilled in the art, and it is intended that the present invention encompass such changes, variations, alterations, transformation, and modifications as they fall within the scope of the appended claims.

To aid the Patent Office, and any readers of any patent issued on this application in interpreting the claims appended hereto, applicants wish to note that they do not intend any of the appended claims to invoke paragraph 6 of 35 U.S.C. §112 as it exists on the date of filing hereof unless the words "means for" or "step for" are explicitly used in the particular claim.

What is claimed is:

1. A heat removal system comprising:
   a heat pipe having a first end and a second end;
   one or more of a plurality of components of a computing system thermally coupled to the first end, the one or more of the plurality of components housed in a computing system compartment; and
   a heat dissipation mechanism coupled to the second end, the heat dissipation mechanism housed in a region that is separated from the computing system compartment, the region comprising:
      a first partially-enclosed region having a fluid of a first pressure;
      a second partially-enclosed region having a fluid of a second pressure, the second pressure lower than the first pressure, the heat dissipation mechanism further housed between the first partially-enclosed region and the second partially-enclosed region; and
      at least one cowling separating the first partially-enclosed region from the second partially-enclosed region and directing fluid from the first partially-enclosed region past the heat dissipation mechanism and towards the second partially-enclosed region.

2. The heat removal system of claim 1, wherein the second end is at a higher elevation than the first end during operation.

3. The heat removal system of claim 1, wherein the one or more of the plurality of components are configured in a computing rack.

4. The heat removal system of claim 3, wherein the computing rack is not associated with a local cooling fan.

5. The heat removal system of claim 1, the heat pipe having a pressurized cavity that is at least partially filled with a refrigerant, wherein the refrigerant:
   vaporizes at the first end,
   travels as a vapor to the second end,
   condensates at the second end, and
   travels as a liquid back to the first end.

6. The heat removal system of claim 1, further comprising a porous material disposed within the heat pipe, the porous material aiding movement of the refrigerant by capillary action.

7. The heat removal system of claim 1, wherein the plurality of components are thermally coupled to the first end without a local cooling fan.

8. The heat removal system of claim 1, wherein the region is an open-air region that is exposed to an outside wind, the outside wind forcing air past the heat dissipation mechanism.

9. The heat removal system of claim 1, wherein the region is a partially-enclosed pressurized plenum, the pressurized plenum forcing a fluid past the heat dissipation mechanism.

10. The heat removal system of claim 9, further comprising at least one fan, the at least one fan forcing the fluid into the pressurized plenum.

11. The heat removal system of claim 10, wherein the fluid is unfiltered, outside atmospheric air.

12. The heat removal system of claim 1, wherein the heat dissipation mechanism comprises a plurality of fins.

13. A method for removing heat from a computer room, comprising:
   providing a heat pipe having a first end and a second end;
   thermally coupling the first end to one or more of a plurality of components of a computing system, the one or more of the plurality of components housed in a computing system compartment;
   coupling a heat dissipation mechanism to the second end, the heat dissipation mechanism housed in a region that is separated from the computing system compartment, the region comprising a first partially-enclosed region, a second partially-enclosed region, and at least one cowling separating the first partially-enclosed region from the second partially-enclosed region; and providing a fluid to the first partially-enclosed region such that fluid in the first partially-enclosed region has a pressure higher than fluid in the second partially-enclosed region and fluid is directed from the first partially-enclosed region past the heat dissipation mechanism and towards the second partially-enclosed region.

14. The method of claim 13, wherein the second end is at a higher elevation than the first end during operation.

15. The method of claim 13, wherein the one or more of the plurality of components are configured in a computing rack.

16. The method of claim 15, wherein the computing rack is not associated with a local cooling fan.

17. The method of claim 13, the heat pipe having a pressurized cavity that is at least partially filled with a refrigerant, wherein the refrigerant:
vaporizes at the first end,
travels as a vapor to the second end,
condensates at the second end, and
travels as a liquid back to the first end.

18. The method of claim 13, further comprising providing a porous material within the heat pipe, the porous material aiding movement of the refrigerant by capillary action.

19. The method of claim 13, wherein the plurality of components are thermally coupled to the first end without a local cooling fan.

20. The method of claim 13, wherein the region is an open-air region that is exposed to an outside wind, the outside wind forcing air past the heat dissipation mechanism.

21. The method of claim 13, wherein the region is a partially-enclosed pressurized plenum, the pressurized plenum forcing a fluid past the heat dissipation mechanism.

22. The method of claim 21, further comprising providing at least one fan, the at least one fan forcing the fluid into the pressurized plenum.

23. The method of claim 22, wherein the fluid is unfiltered, outside atmospheric air.

24. The method of claim 13, wherein the heat dissipation mechanism comprises a plurality of fins.

\* \* \* \* \*